United States Patent [19]

Doyle

[11] Patent Number: 4,684,886

[45] Date of Patent: Aug. 4, 1987

[54] AUTOMATIC EQUALIZER

[76] Inventor: James H. Doyle, 1247 W. Grove Ave., Orange, Calif. 92665

[21] Appl. No.: 735,470

[22] Filed: May 17, 1985

[51] Int. Cl.⁴ .................. G01R 15/10; G06G 7/12; H03F 1/36
[52] U.S. Cl. .................. 324/132; 328/142; 330/104
[58] Field of Search .............. 324/132; 328/14, 142, 328/145; 364/851, 852, 853; 330/85, 104, 105, 107

[56] References Cited

U.S. PATENT DOCUMENTS

| | | | |
|---|---|---|---|
| 2,796,469 | 6/1957 | Papouschek | 330/104 |
| 3,225,216 | 12/1965 | Grabowski | 330/104 |
| 3,955,150 | 5/1976 | Soderstrand | 330/107 |
| 4,147,989 | 4/1979 | Brolde | 328/142 |

*Primary Examiner*—Reinhard J. Eisenzopf
*Assistant Examiner*—Vinh P. Nguyen

*Attorney, Agent, or Firm*—Fulwider, Patton, Rieber, Lee & Utecht

[57] ABSTRACT

An automatic equalizer for an electronic measuring instrument using a transducer to measure a physical quantity. A signal amplifier in the instrument has a positive feedback application point and a negative feedback application point. The automatic equalizer has a plurality of stages, each comprising an amplifier that draws its input from the compensated output of the signal amplifier. Each equalizer stage is biased to operate over a different range of output signal levels, and the amount of feedback supplied by each stage back to the positive and negative feedback application points is separately adjustable so as to equalize a different segment of the transducer response curve. The required bias signal level for each equalizer is independent of the response characteristics of the transducer and therefore can be determined solely with reference to the range of magnitudes of the output signal.

10 Claims, 5 Drawing Figures

AUTOMATIC EQUALIZER

BACKGROUND OF THE INVENTION

1. Field of the Invention

The present invention relates generally to electronic measuring instruments, and in particular to electronic instruments having transducers that produce electrical signals in response to physical quantities and electronic circuitry that processes those signals.

2. The Prior Art

Electronic instruments using transducers that produce electrical signals indicative of the magnitudes of physical quantities are known to the art. Examples of such instruments include electronic scales and gas flow controllers. Typically, a transducer employed by such an instrument is connected as an arm of a bridge circuit, and when a physical quantity to be measured (such as weight, gas flow, or the like) is sensed by the transducer, the bridge becomes unbalanced in an amount related to the magnitude of the quantity being measured. The degree of unbalance of the bridge is manifested as an electrical signal, and this bridge signal is amplified by a bridge amplifier to yield an output signal that in turn can be used for such purposes as activation of a display or control of a process that depends on the magnitude of the measured quantity.

Ideally, the bridge signal would be directly proportional to the magnitude of the physical quantity being measured, because such proportionality is necessary in order to produce a usable readout from the signal. However, because presently available transducers are rarely capable of producing a signal that is proportional to the magnitude of the measured quantity, such direct proportionality can only be achieved by applying a correction factor to the bridge signal. The process of deriving and applying such a correction factor is referred to herein as the process of "equalizing" the bridge signal.

A useful method of equalizing a bridge signal, known to the art, consists of applying a fixed correction signal to an amplifier stage. Such a correction signal alters the gain of the amplifier stage, causing the signal at the output of the amplifier to be proportional to the magnitude of the quantity being measured. Unfortunately, any one correction signal only yields an exactly correct output for one single value of input, and therefore an infinite number of correction signals, one for each possible input signal value, would theoretically be required to make the output signal proportional to the magnitude of the measured quantity over the entire range of the instrument. Fortunately, however, in practice as few as four correction signals, each operative over a limited range of input signal values, are sufficient to cause the output signal to be sufficiently close to proportional to the magnitude of the physical quantity being measured that the instrument will give acceptably accurate results over its entire range.

One method of generating such correction signals is to use a plurality of inverting operational amplifiers. Each such amplifier receives as its input the bridge signal. The output of each such amplifier is configured to alter the gain of an amplifier stage in the bridge amplifier, and each operational amplifier is biased so that it will not produce an output until its input exceeds the magnitude of the bias. By carefully choosing the bias levels to be applied to the various operational amplifiers, the circuit can be so configured that each operational amplifier will correct the gain over a different portion of the range of the instrument, resulting in an overall output response curve that is very close to perfectly proportional to the measured quantity.

If each transducer of a given kind could be counted on to have nearly the same response characteristic as every other transducer of the same kind, then a single set of appropriate bias values could be derived and used to bias the operational amplifiers in each instrument employing such a transducer. However, there is often a wide variance in response characteristics from one transducer to another, and bias values must therefore be individually derived for each instrument using such a transducer. The need to derive such bias values anew for each instrument tends to make the circuitry more complex than it would otherwise have to be in that adjustments for all the bias sources must be provided, and it tends to make the alignment process more complex in that each bias source must be individually aligned according to the individual response characteristic of the transducer used in that instrument, a costly and time-consuming process.

It will be apparent from the foregoing that there is a need for an electronic measuring instrument employing a plurality of operational amplifiers to equalize the response characteristic of the transducer that does not require individual alignment of the bias sources to coincide with each different transducer. The present invention satisfies this need.

SUMMARY OF THE INVENTION

The present invention resides in an improvement to an electronic measuring instrument of the kind having a transducer responsive to a physical quantity to be measured, means such as a bridge circuit for producing a signal from the transducer, a transducer signal amplifier, and a plurality of operational amplifiers that compensate for the non-linear response characteristic of the transducer by applying to the transducer amplifier gain-correcting signals that are activated by a comparison between the magnitude of the transducer signal and the magnitudes of a plurality of bias signals. Briefly and in general terms, the improvement comprises a circuit arrangement wherein each operational amplifier obtains its input, not from the transducer signal, but from the compensated output signal of the transducer amplifier, thereby enabling the value of each bias signal to be a fixed, predetermined percentage of the range of the output signal rather than an individually derived value that depends on the individual response characteristic of the particular transducer used in that instrument.

In accordance with the invention, an automatic equalizer operates in conjunction with a signal amplifier that has both positive and negative feedback inputs, a signal applied to the positive feedback input tending to increase the gain of the amplifier and a signal applied to the negative feedback input tending to reduce the gain of the amplifier. The automatic equalizer comprises a plurality of operational amplifiers, typically three, configured such that a summing input of each combines the output signal from the signal amplifier with a predetermined bias signal, a different bias signal being used for each operational amplifier. The output of each operational amplifier is applied through a potentiometer to the positive and negative feedback inputs of the signal amplifier. The potentiometer associated with each operational amplifier can be adjusted to cause that operational amplifier to either increase or reduce the overall gain of the signal amplifier by an amount that depends on the setting of that potentiometer. Values are chosen for the bias signals such that each operational amplifier will be effective over a different portion of the output signal range of the amplifier. The required bias values are, therefore, independent of the response characteristic of the signal applied to the input of the signal amplifier and need not be derived anew for each transducer.

It will be appreciated from the foregoing that the present invention represents a significant advance in the field of electronic measuring instruments. In particular, such an instrument embodying the present invention will be simpler to align and therefore will remain accurate longer than an instrument constructed according to the prior art. Other aspects and advantages of the present invention will become apparent from the following more detailed description taken in conjunction with the accompanying drawings.

DESCRIPTION OF THE PREFERRED EMBODIMENT

An equalizer circuit for an electronic measuring instrument according to the prior art requires a set of bias signals that must be individually derived to match the individual response curve of the transducer employed in the instrument. The present invention provides an equalizer circuit that responds to predetermined ranges of the output signal of a measuring instrument and therefore requires a predetermined set of bias signals that are independent of the characteristics of the transducer being used.

Figure 1:
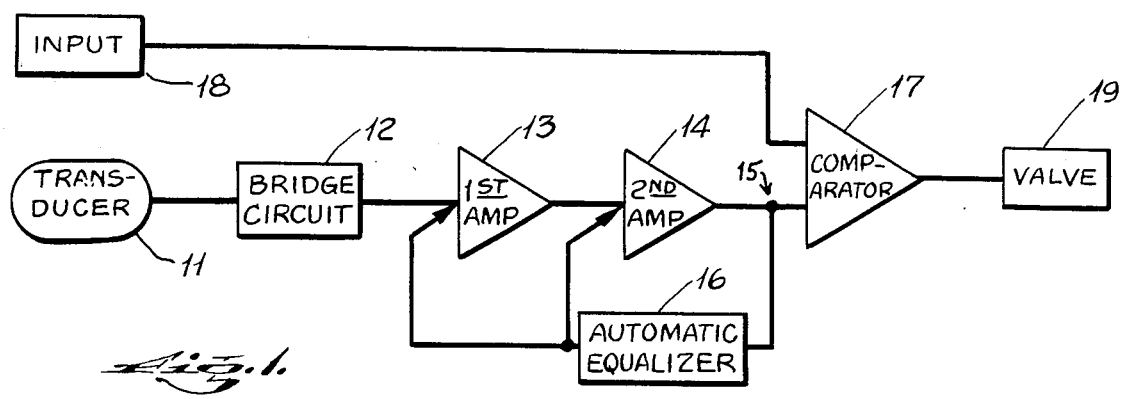
FIG. 1 is a block diagram of an electronic gas flow measuring instrument incorporating an automatic equalizer according to the present invention.

In a typical electronic instrument for measuring a physical quantity—in this case, the rate of flow of a gas—a transducer 11 is connected in a bridge circuit 12 as shown in block form in FIG. 1. The bridge circuit 12 generates a signal that is applied in turn to a first amplifier stage 13 and a second amplifier stage 14. The second amplifier stage 14 has an output signal that is applied at connection point 15 to an automatic equalizer 16 embodying the present invention, and the automatic equalizer 16 applies compensation signals back to the first and second amplifier stages 13 and 14, causing the magnitude of the output of the second amplifier stage 14 to be directly proportional to the magnitude of the physical quantity being measured. A comparator 17 generates a control signal according to any difference between the actual rate of flow of the gas, as indicated by the magnitude of the output signal at the connection point 15, and the desired rate of flow according to data provided at an input 18, and this control signal is applied to a valve 19, causing it to adjust the rate of flow of the gas until the measured rate of flow is equal to the desired rate of flow. In other kinds of electronic measuring instruments, the output signal at the connection point 15 might be applied to a visual display readout or to some other kind of process control.

Figure 2:
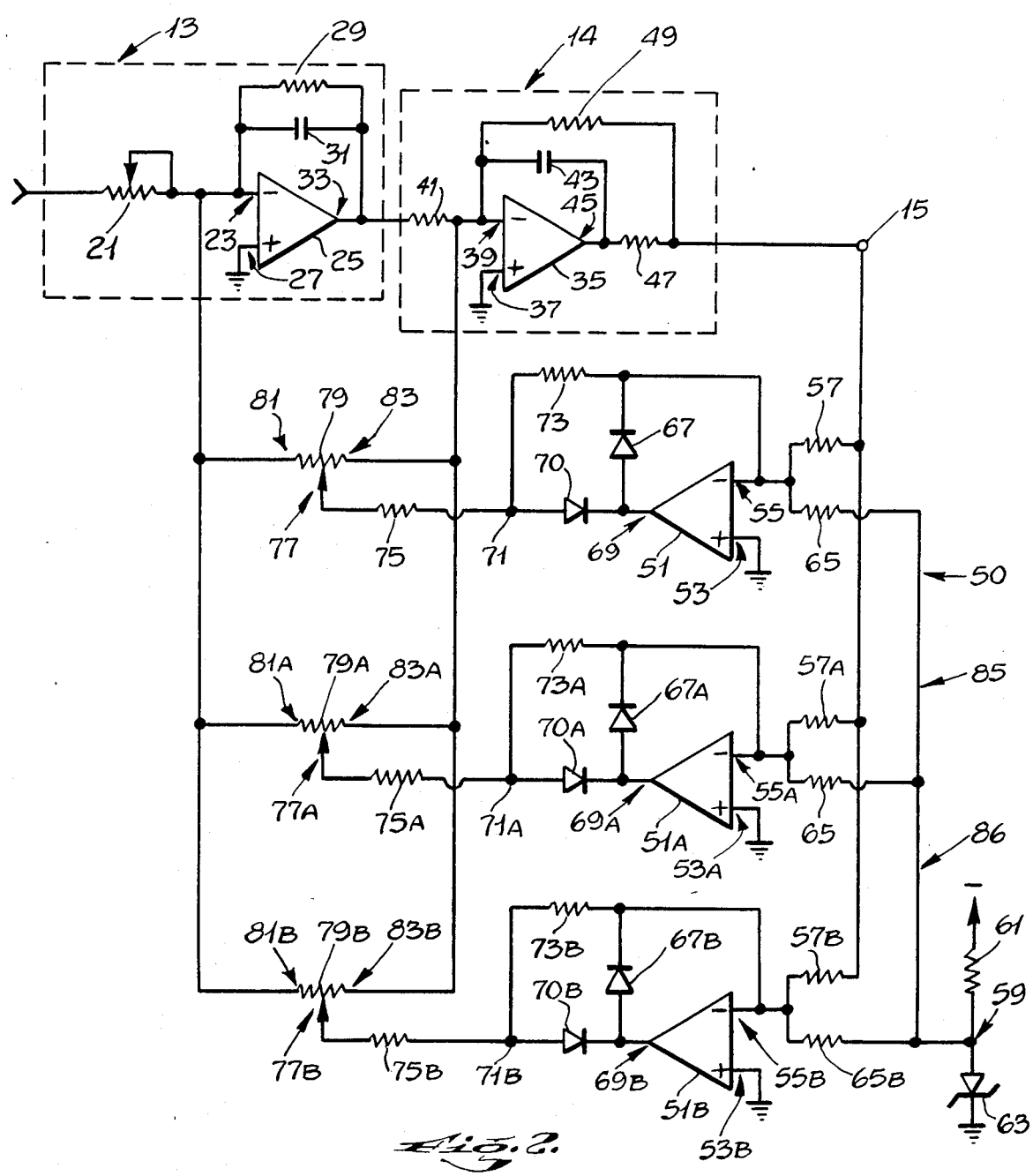
FIG. 2 is a schematic diagram of an automatic equalizer according to the present invention.

The first amplifier stage 13 has an input gain control 21, through which the output of the bridge circuit 12 is applied to the summing input 23 of an operational amplifier 25, as shown in FIG. 2. The non-inverting input 27 of the amplifier 25 is connected to ground, and a feedback resistor 29 and a feedback capacitor 31 are connected between the summing input 23 and the output 33 of the amplifier 25. The second amplifier stage 14 comprises an operational amplifier 35 having its non-inverting input 37 connected to ground and its summing input 39 connected through a resistor 41 to the output 33 of the amplifier 25. A feedback capacitor 43 is connected from the summing input 39 to the output 45 of the amplifier 35. The output 45 is connected through a resistor 47 to the connection point 15, and a feedback resistor 49 is connected from the connection point 15 to the summing input 39.

The automatic equalizer 16 has a first equalizer stage 50 comprised of an operational amplifier 51 having its non-inverting input 53 connected to ground and its summing input 55 connected to the connection point 15 through a resistor 57. A bias source is developed at a junction 59 between a resistor 61 and a Zener diode 63, the resistor 61 and the Zener diode 63 being connected in series between a power supply voltage and ground. A resistor 65 applies a bias current developed from the bias source at the junction 59 to the summing input 55.

A first diode 67 is connected between the summing input 55 and the ouput 69 of amplifier 51. A second diode 70 is connected between the output 69 and a junction point 71 defined by a connection between the second diode 70 and a feedback resistor 73, the other end of the feedback resistor 73 being connected to the summing input 55. The first diode 67 prevents the amplifier 51 from developing a correction signal at the junction point 71 unless the current developed by the output signal at the point 15 through the resistor 57 at the summing input 55 exceeds the bias current developed through the resistor 65.

When the amplifier 51 produces a correction signal at the junction point 71, the correction signal is applied through a resistor 75 to a wiper contact 77 of a potentiometer 79. One leg 81 of the potentiometer 79 is connected to the summing input 23 of the first amplifier stage 13, and the other leg 83 of the potentiometer 79 is connected to the summing input 39 of the second amplifier stage 14.

The automatic equalizer 16 also has a second equalizer stage 85 and a third equalizer stage 87. Each of these stages is comprised of a circuit just like the circuit of the first equalizer stage 50. For convenience, components in the second stage 85 that are similar to components in the first stage 50 are assigned the same reference numerals accompanied by the letter "A", and components in the third stage 87 that are similar to components in the first stage 50 are assigned the same reference numerals accompanied by the letter "B". The second and third stages 85 and 87, like the first stage 50, receive their inputs from the connection point 15 and apply their outputs to the summing input 23 of the first amplifier stage 13 and to the summing input 39 of the second amplifier stage 14. The only components that are not the same are the bias resistors 65A and 65B, each such bias resistor being selected to apply a different bias voltage to the summing input of its respective operational amplifier. It will be apparent that additional equalizer stages could be added if desired.

The first equalizer stage 50 has no effect on the first and second amplifier stages 13 and 14 until the magnitude of the current developed by the output signal at the connection point 15 becomes equal to the bias current developed through the bias resistor 65. If the bias resistor 65 is selected so that the bias current it develops has a magnitude equal to 25% of the possible maximum magnitude of the current developed by the output signal, then the first equalizer stage 50 will function only during those times that the magnitude of the output signal is within the upper 75% of its range. Likewise, if the bias resistor 65A is selected so that the bias current it develops is equal to 50% of the possible maximum output signal, then the second equalizer stage 85 will function only during those times that the output signal is within the upper 50% of its range, and if the bias resistor 65B is selected so that the bias current it develops is equal to 75% of the possible maximum output signal, then the third equalizer stage 87 will function only during those times that the magnitude of the output signal is within the upper 25% of its range.

Once the bias resistors 65, 65A, and 65B have been selected, the gain control 21 and the potentiometers 79, 79A, and 79B should be adjusted to make the output signal as closely proportional to the physical quantity being measured as possible. This is done by adjusting each of said controls to optimize the output signal within the respective ranges set by the bias resistors. First the gain control 21 is adjusted to minimize errors in the output signal through the 0-25% range of possible output signal values, none of the equalizing stages having any effect in this range. Next, the potentiometer 79 is adjusted to minimize errors in the output signal through the 25-50% range; then, potentiometer 79A is adjusted with respect to the 50-75% range; and finally potentiometer 79B is adjusted with respect to the 75-100% range.

Figure 3:
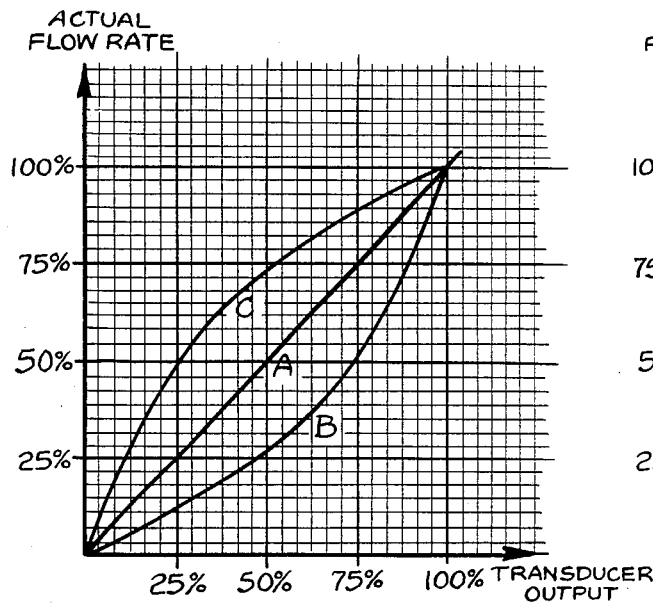
FIG. 3 is a graph showing an ideal transducer response curve and two typical, realizable transducer response curves.
Figure 4:
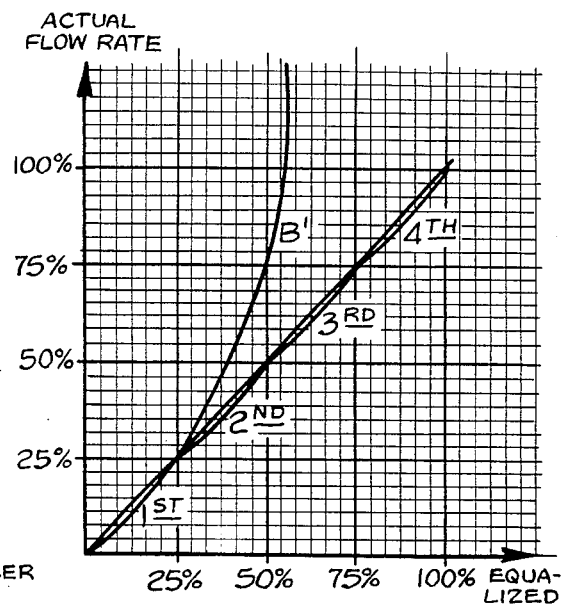
FIG. 4 is a graph illustrating the effect of an automatic equalizer according to the present invention on a typical transducer response curve.

The effect of the equalizer circuits is illustrated graphically in FIGS. 3 and 4. Straight line A of FIG. 3 represents an ideal, directly proportional relationship between the magnitude of a transducer signal, plotted on the horizontal axis of the graph, and the magnitude of the physical quantity being measured, plotted on the vertical axis of the graph. Curves B and C represent the results actually obtainable from typical, realizable transducers. FIG. 4 illustrates the effect of the equalizer circuits on the output from a measuring instrument that uses a transducer having a response curve similar to curve B. Initially, adjustment of the input gain control 21 results in shifting curve B into position B', bringing the first segment of curve B' into close alignment with the ideal straight line response A. At the 25% point, the first equalizer circuit 50 begins to function, bringing the second segment of curve B' into close alignment with the line A; at the 50% point, the second equalizer 85 operates to correct the third segment of curve B', and at the 75% point the third equalizer 87 operates to correct the fourth segment.

It will be apparent that the various equalizer circuits could be biased to operate over any desired portions of the range of the output signal rather than the 25%, 50%, and 75% portions illustrated, and that additional equalizer circuits, each effective over a more limited range, could be used if desired.

Figure 5:
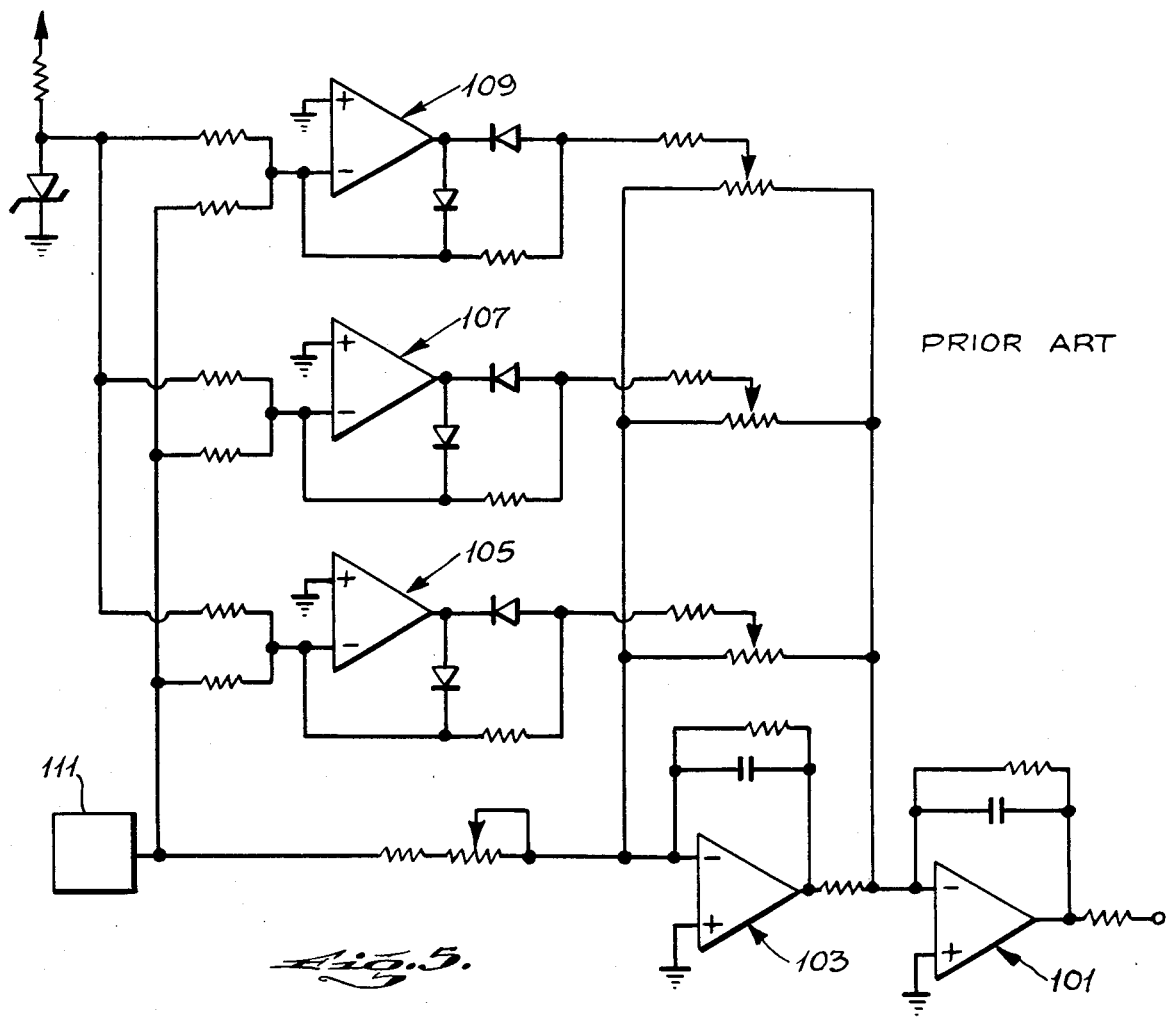
FIG. 5 is a schematic diagram of an equalizer according to the prior art.

An equalizer according to the prior art, as shown in FIG. 5, has a plurality of amplifier stages 101 and 103 and a plurality of equalizer stages 105, 107 and 109. Each equalizer stage draws its input from an uncompensated signal derived from a transducer and bridge circuit 111, and accordingly the bias signal applied to each equalizer stage must be adjusted according to the particular response curve of the particular transducer used.

An automatic equalizer according to the present invention represents a significant improvement in that the equalizer stages receive their inputs from the compensated output, and hence the bias signals applied to each such stage are independent of the response curve of the particular transducer used; accordingly, an electronic measuring instrument embodying the present invention is more economical to manufacture and is easier to align.

Various modifications and changes may be made with regard to the foregoing detailed description without departing from the spirit of the invention. In addition, while disclosed in the context of a gas flow measuring device, the invention has application in many other kinds of electronic measuring apparatus. It is therefore to be understood that, within the scope of the appended claims, the invention may be practiced otherwise than as specifically described.

I claim:

1. An automatically equalized amplifier to provide an amplified signal in response to an input signal, comprising:
   a signal amplifier having positivie and negative feedback inputs and operative to provide an amplified signal in response to an input signal, a feedback signal applied to the positive feedback input tending to increase the gain of the signal amplifier and a feedback signal applied to the negative feedback input tending to reduce the gain of the signal amplifier;
   a first feedback amplifier, responsive to the amplified signal to provide a first correction signal;
   means to apply a first portion of the first correction signal as a feedback signal to the positive feedback input;
   means to apply a second portion of the first correction signal as a feedback signal to the negative feedback input;
   a second feedback amplifier, responsive to the amplified signal to provide a second correction signal;
   means to apply a first portion of the second correction signal as a feedback signal to the positive feedback input; and
   means to apply a second portion of the second correction signal as a feedback signal to the negative feedback input.

2. An automatically equalized amplifier according to claim 1 and further comprising means to prevent the first feedback amplifier from providing the first correction signal unless the magnitude of the amplified signal exceeds the magnitude of a predetermined signal.

3. An automatically equalized amplifier according to claim 1 and further comprising means to apply a first bias signal to the first feedback amplifier, the first feedback amplifier being operative to provide the first correction signal only if the magnitude of the amplified signal exceeds the magnitude of the first bias signal.

4. An automatically equalized amplifier according to claim 3 and further comprising means to apply a second bias signal having a magnitude larger than the magnitude of the first bias signal to the second feedback amplifier, the second feedback amplifier being operative to provide the second correction signal only if the magnitude of the amplified signal exceeds the magnitude of the second bias signal.

5. An automatically equalized amplifer according to claim 1 wherein the means to apply the first and second portions of the first correction signal to the positive and negative feedback inputs, respectively, comprises a potentiometer.

6. In a measuring instrument for providing a signal indicative of a physical quantity according to a characteristic response curve, the instrument having a transducer responsive to the physical quantity to provide a signal indicative of the quantity and an amplifier for amplifying said signal to provide an amplified signal indicative of the quantity, the amplifier having positive and negative feedback inputs, a feedback signal applied to the positive feedback input tending to increase the gain of the amplifier and a feedback signal applied to the negative feedback input tending to reduce the gain of the amplifier, an improvement for equalizing the response curve, the improvement comprising:

a first feedback amplifier, responsive to the amplified signal to provide a first correction signal;

means to apply a first portion of the first correction signal as a feedback signal to the positive feedback input;

means to apply a second portion of the first correction signal as a feedback signal to the negative feedback input;

a second feedback amplifier, responsive to the amplified signal to provide a second correction signal;

means to apply a first portion of the second correction signal as a feedback signal to the positive feedback input; and means to apply a second portion of the second correction signal as a feedback signal to the negative feedback input.

7. An improvement according to claim 6 and further comprising means to prevent the first feedback amplifier from providing the first correction signal unless the magnitude of the amplified signal exceeds the magnitude of a predetermined signal.

8. An improvement according to claim 6 and further comprising means to apply a first bias signal to the first feedback amplifier, the first feedback amplifier being operative to provide the first correction signal only if the magnitude of the amplified signal exceeds the magnitude of the first bias signal.

9. An improvement according to claim 8 and further comprising means to apply a second bias signal having a magnitude larger than the magnitude of the first bias signal to the second feedback amplifier, the second feedback amplifier being operative to provide the second correction signal only if the magnitude of the amplified signal exceeds the magnitude of the second bias signal.

10. An improvement according to claim 6 wherein the means to apply the first and second portions of the first correction signal to the positive and negative feedback inputs, respectively, comprises a potentiometer.

* * * * *